United States Patent
Sanghani (12)

(10) Patent No.: US 6,629,277 B1
(45) Date of Patent: Sep. 30, 2003

(54) LSSD INTERFACE

(75) Inventor: Amit D. Sanghani, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/504,595

(22) Filed: Feb. 15, 2000

(51) Int. Cl.$^7$ ............................................. G01R 31/28
(52) U.S. Cl. ...................... 714/731; 714/727
(58) Field of Search ................. 714/726, 727, 714/731

(56) References Cited

U.S. PATENT DOCUMENTS

| | | | |
|---|---|---|---|
| 3,761,695 A | | 9/1973 | Eichelberger |
| 3,783,254 A | | 1/1974 | Eichelberger |
| 4,293,919 A | | 10/1981 | Dasgupta et al. |
| 4,477,738 A | | 10/1984 | Kouba |
| 5,172,011 A | * | 12/1992 | Leuthold et al. ............ 327/202 |
| 5,463,338 A | | 10/1995 | Yurash |
| 5,617,426 A | * | 4/1997 | Koenemann et al. ....... 714/726 |
| 5,748,645 A | * | 5/1998 | Hunter et al. ............... 714/726 |
| 5,783,960 A | * | 7/1998 | Lackey ........................ 327/295 |
| 5,920,575 A | * | 7/1999 | Gregor et al. .............. 714/726 |
| 6,040,725 A | * | 3/2000 | Lee et al. .................... 327/175 |
| 6,304,122 B1 | * | 10/2001 | Gregor et al. .............. 327/202 |

FOREIGN PATENT DOCUMENTS

EP          0 651 261 A2     5/1995

OTHER PUBLICATIONS

Automated Chip Array Testing, IBM Technical Disclosure Bulletin NN87023873, Feb. 1987, US, vol. No.: 29, Issue No.: 9, Page No.: 3873–3874.*

Synchronization of LSSD System Clocks to Asynchronous Signals, IBM Technical Disclosure Bulletin NN85014934, Jan. 1985, US, vol. No.: 27, Issue No.: 8, Page No.: 4934–4937.*

Interface Freeze Mechanism, IBM Technical Disclosure Bulletin NN78013060, Jan. 1978, US, vol. No.: 20, Issue No.: 8, Page No.: 3060–3062.*

NN78055260, Adapter for Controlling LSSD Logic in a Non LSSD Environment, IBM Technical Disclosure Bulletin, US, vol. No.: 20, Issue No.: 12, pp.: 5260–5262, May 1, 1978.*

European Searach Report dated Aug. 1, 2001, 6 pages.

* cited by examiner

Primary Examiner—David Ton
Assistant Examiner—Joseph D. Torres
(74) Attorney, Agent, or Firm—Rosenthal & Osha L.L.P.

(57) ABSTRACT

An interface in an integrated circuit allows an LSSD storage element and a non-LSSD storage element to function together in the same scan chain. The interface has a data lock-up module, a test enable module, a master observe module, and a clock generator module. The data lock-up module latches data to be scanned into the integrated circuit through the scan chain. The test enable module indicates the status of a tester for testing the integrated circuit. The clock generator module generates a write clock and separate, non-overlapping master and slave scan clocks for a master latch and a slave latch in the LSSD storage element. The master observe module selectively asserts the slave scan clock prior to the master scan clock in order to latch the initial data bit appearing at the master latch.

17 Claims, 11 Drawing Sheets

LSSD INTERFACE

LSSD INTERFACE

The invention is related to LSSD storage elements and, in particular, to a method and apparatus for interfacing an LSSD storage element with a non-LSSD storage element to facilitate operation and testing of an integrated circuit that uses both types of storage methodologies.

BACKGROUND OF THE INVENTION

Digital integrated circuits often include a number of storage elements such as latches and flip-flops that temporarily store logical states (e.g., HIGH or LOW) within the integrated circuit. Data from a component of the integrated circuit are received by the storage elements, latched or otherwise stored, and then outputted to the same and/or another component of the integrated circuit. It is often useful to selectively set the data stored in the storage elements, for example, in order to operate the integrated circuit from a known logical state. Similarly, it is also useful to shift an entire sequence of bits into the storage elements to test the integrated circuit. In the latter case, two or more storage elements are daisy-chained together so the output of one feeds the input of the next, and so on. Then, one of the storage elements in the chain is tapped, that is, selected as the point at which to shift in the controlled test bits. Similarly, a sequence of bits can be shifted out from the integrated circuit onto the chain and observed at the same or another storage element and compared with an expected output. This shifting is also referred to as "scanning." The chain of storage elements is referred to as a "scan chain."

One common type of storage element is a Muxscan storage element 10, depicted in FIG. 1A as a multiplexer MUX connected to a flip-flop FF. The multiplexer MUX has two inputs 0 and 1 which are selectable via a select input SEL, and an output O. The 0 and 1 inputs are typically connected to a data signal DATA and a scan-in signal SI, respectively, and the select input SEL is typically connected to a scan-enable signal SE. The DATA signal carries logic states from a predefined component of the integrated circuit during normal operation, and the scan-in signal SI provides logic states from, for example, a tester, for purposes of testing the integrated circuit. When the scan-enable signal SE is at logic LOW, the multiplexer MUX selects the DATA signal as the output. When the scan-enable signal SE is at logic HIGH, the multiplexer MUX selects the SI signal as the output. The output O is connected to an input D of the flip-flop FF, which also has a data output Q. In operation, upon assertion of a clock signal CLK, the flip-flop FF latches whatever data are at its input D (from either the DATA or SI signal) and outputs this data at the output Q.

FIG. 1B shows a simplified version of the Muxscan storage element 10 of FIG. 1A. The multiplexer MUX and the flip-flop FF of FIG. 1A have been combined into a single device that is functionally identical to the device shown in FIG. 1A.

Another type of storage element is the Level-Sensitive Scan Design, or LSSD, storage element. Generally, LSSD storage elements have an advantage over non-LSSD storage elements in that their operation does not depend on the exact timing of a clock signal. Instead, operation of an LSSD storage element depends solely on whether the clock signal has occurred, i.e., whether it has attained a certain, predefined voltage level, and not on when the clock signal has occurred. This insensitivity to exact timing avoids timing related problems such as clock skew and rise or fall times dependencies. However, LSSD storage elements have more stringent design requirements. For example, each latch in an LSSD storage element must have its own clock signal, and the clock signals may not overlap.

A popular type of LSSD storage element called an "L2-Star" is functionally depicted in FIG. 2. This storage element 20 has a master latch L1 and a slave latch L2 connected together. Both latches L1 and L2 have a set of inputs D1 and D2 which are latched by clock inputs CLK1 and CLK2, respectively. An output Q outputs the data from either the D1 or D2 input (whichever is latched last) on both latches L1 and L2. The master latch L1 outputs a master output signal QM and the slave latch L2 outputs a slave output signal QS. The input D1 of the master latch L1 is connected to a data signal DM carrying logic states from a predefined component of the integrated circuit, while the corresponding input D1 of the slave latch L2 is connected to another data signal DS. A write clock signal WCLK global to the integrated circuit is connected to the clock inputs CLK1 of both latches L1 and L2 for latching the data from the DM and DS signals. The input D2 of the master latch L1 is connected to a scan-in signal SI carrying logic states from, for example, a tester, for purposes of testing the integrated circuit, while the corresponding input D2 of the slave latch L2 is connected to the master output signal QM from the master latch L1. A master scan clock ACLK latches the data from the scan-in signal SI and a slave scan clock BCLK latches the data from the QM signal.

Operation of the LSSD storage element 20 will now be described with reference to the timing diagram of FIG. 3. During normal operation, the master latch L1 and the slave latch L2 both functions as independent storage elements. Upon assertion of the write clock WCLK, data carried by the signals DM and DS are latched by the two latches L1 and L2 and outputted as the output signals QM and QS, respectively. Note the two scan clocks ACLK and BCLK are inactive at this time, and the scan-in signal SI is in a "don't care" state.

During testing, or scan operation, the master latch L1 and the slave latch L2 operate together to form a 2-position shift register. Upon assertion of the master scan clock ACLK, the data from the scan-in signal SI is latched by the master latch L1 and outputted as the master output signal QM. This same data will then be latched by the slave latch L2 upon assertion of the slave scan clock BCLK and outputted as the slave output signal QS. Note, for proper operation of the scan function, the two scan clocks ACLK and BCLK must not overlap each other.

As can be seen from the timing diagram, the L2-Star configuration uses both latches L1 and L2 as independent storage elements during normal operation. However, during scan operation, the master latch L1 feeds the slave latch L2 and the latches are no longer independent. As such, in a scan chain made of multiple L2-Star storage elements, asserting the master scan clock ACLK first at the start of the scan operation destroys the initial data bit going into the input D2 of the slave latch L2. Likewise, asserting the slave scan clock BCLK first destroys the initial data bit going into input D2 of the following master latch L1. By way of example, say the scan-in signal SI is HIGH at the start of the scan operation while the master output signal QM is LOW. Upon assertion of the master scan clock ACLK, the HIGH from the scan-in signal SI is latched by the master latch L1 and the master output signal QM becomes HIGH, thus displacing the previous LOW before it can be latched by the slave latch L2. A similar displacement occurs at the next master latch in the scan chain if the slave scan clock BCLK is asserted first. Therefore, each scan operation would have to be executed twice, once with the master scan clock ACLK asserted first, and once with the slave scan clock BCLK asserted first, in order to capture all the data.

Moreover, because L2-Star type storage elements requires three separate clocks WCLK, ACLK and BCLK, they are generally not compatible with integrated circuits designed for Muxscan storage elements which require only one clock. In order to use both types of storage elements in the same scan chain, the integrated circuit would have to be modified to provide two additional separate, non-overlapping scan clocks.

SUMMARY OF THE INVENTION

The invention relates to a method and apparatus for interfacing an LSSD storage element with a non-LSSD storage element to facilitate operation and testing of an integrated circuit that uses both types of storage methodologies.

In general, in one embodiment, the invention is related to a method of interfacing a level-sensitive scan design storage element to a non-level-sensitive scan design storage element in an integrated circuit, the level-sensitive scan design storage element having a master latch and a slave latch. The method includes receiving a clock signal, generating separate, non-overlapping clocks for the master latch and the slave latch from the clock signal, and controlling an order of asserting the separate, non-overlapping clocks for the master latch and the slave latch.

In general, in one embodiment, the invention is related to an interface for interfacing an LSSD storage element with a non-LSSD storage element in an integrated circuit, the LSSD storage element having a master latch and a slave latch. The interface includes a test enable module, a clock generator module, and a master observe module connected to the test enable module and clock generator module. The test enable module is arranged to generate a test enable signal and the clock generator module is arranged to generate separate, non-overlapping clocks for the master latch and the slave latch. The master observe module is configured to selectively latch an initial data bit of the master latch by controlling separate, non-overlapping clocks of the master latch and the slave latch upon receipt of the tester enable signal.

In general, in one embodiment, the invention is related to a scan chain, including a non-LSSD storage element, an LSSD storage element having a master latch and a slave latch, and an interface connected between the two latches. The interface is configured to generate separate, non-overlapping clocks for the master latch and the slave latch and to control a latching order of the master latch and the slave latch.

In general, in one embodiment, the invention is related to an interface for interfacing an LSSD storage element with a non-LSSD storage element in an integrated circuit, the LSSD storage element having a master latch and a slave latch. The interface includes means for receiving a clock signal, means for generating separate, non-overlapping clocks for the master latch and the slave latch from the clock signal, and means for selectively asserting one of the separate, non-overlapping clocks for the master latch and the slave latch before the other.

In general, in one embodiment, the invention is related to an apparatus for interfacing an L2-Star storage element with a Muxscan storage element in an integrated circuit, the L2-Star storage element having a master latch and a slave latch. The apparatus includes a data lock-up module for latching data to be scanned into the integrated circuit, a test enable module for generating a tester enable signal, a clock generator module for generating a write clock and separate, non-overlapping master and slave scan clocks for the master latch and the slave latch, and a master observe module or selectively scanning an initial data bit from the master latch into the slave latch, depending on the generation of the tester enable signal, by asserting the slave scan clock before asserting the master scan clock.

Advantages of the invention include allowing LSSD storage elements to operatetogether with non-LSSD storage elements in an integrated circuit designed primarily for the non-LSSD storage elements. Other advantages of the invention will become apparent from the following description and the claims.

DETAILED DESCRIPTION OF THE PREFERRED EMBODIMENTS

As mentioned previously, LSSD storage elements are generally not compatible with integrated circuits designed for non-LSSD storage elements. In order to use both types in the same scan chain, an interface is needed to convert the single clock of the integrated circuit to separate, non-overlapping clocks, and to facilitate control of the order of assertion of the master and slave scan clocks.

Figure 4:
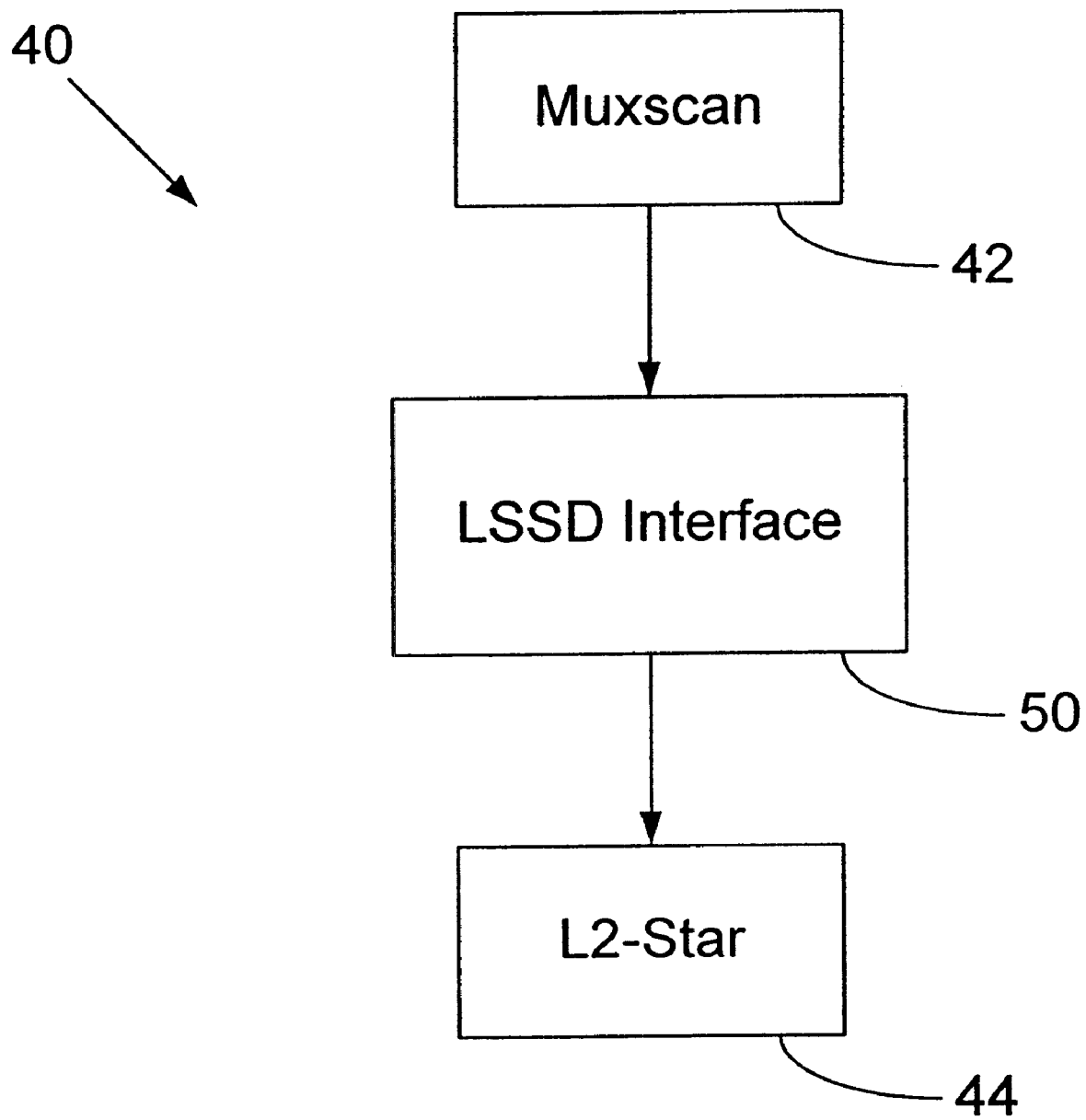
FIG. 4 is a block diagram of a portion of a scan chain.

Referring to FIG. 4, a portion of a scan chain 40 contains a non-LSSD storageelement 42, an LSSD storage element 44, and an LSSD interface 50 connecting the non-LSSD storage element 42 and the LSSD storage element 44 together as shown. The scan chain 40 can be used to scan data into and out of the integrated circuit with the scan direction indicated by the arrows. Although only two storage elements are shown here, the entire scan chain 40 may, of course, be much longer and may have as many non-LSSD and LSSD type storage elements as needed. Indeed, scan-in and scan-out typically occur at the same time because the scan chain 40 is usually long enough such that while data are being scanned in, response data produced by the circuit start to scan out on the scan chain 40. The non-LSSD storage element 42 may be, for example, the Muxscan storage element discussed previously, and the LSSD storage element 44 may be, for example, the L2-Star.

Figure 2:
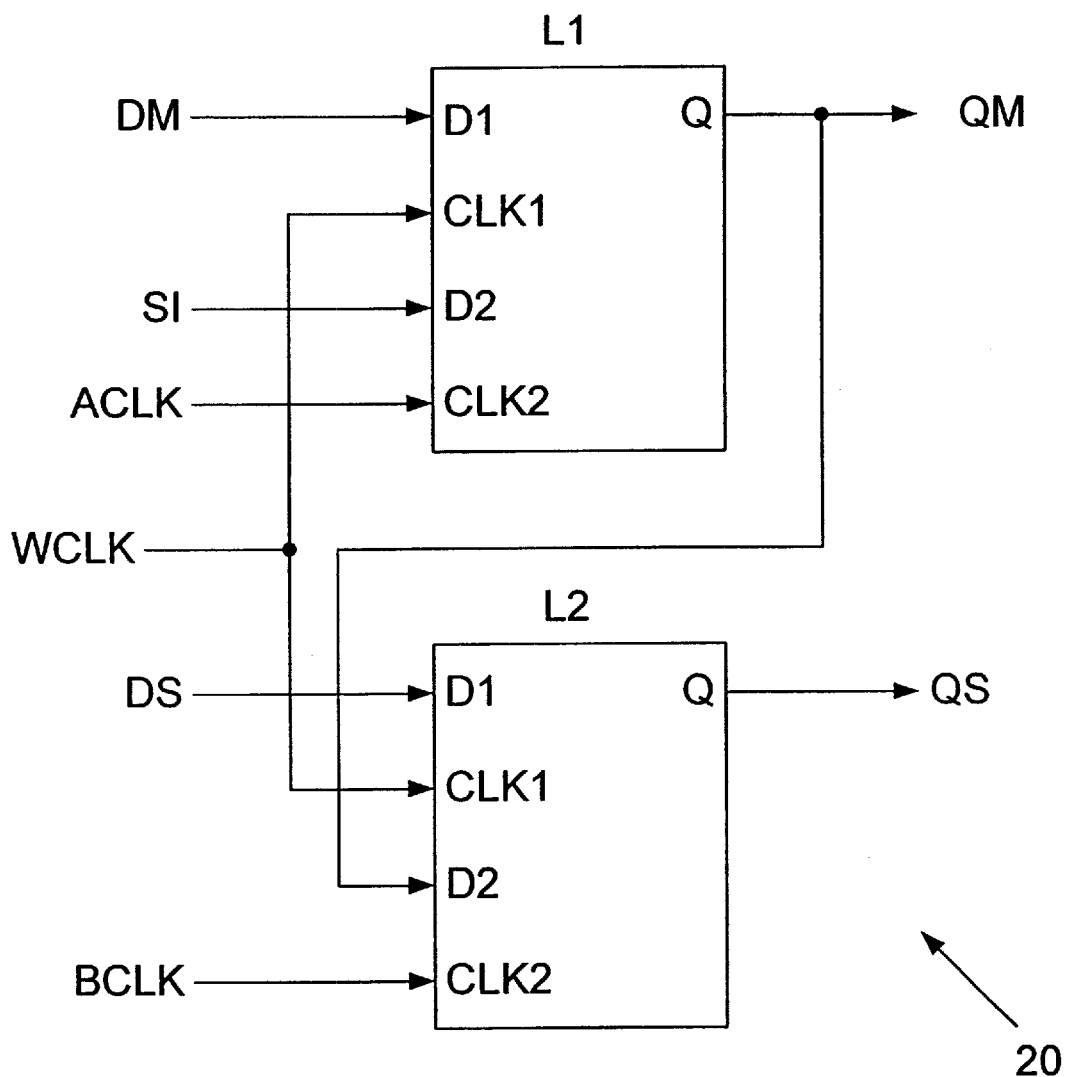
FIG. 2 is a functional diagram of a prior art LSSD storage e
Figure 3:
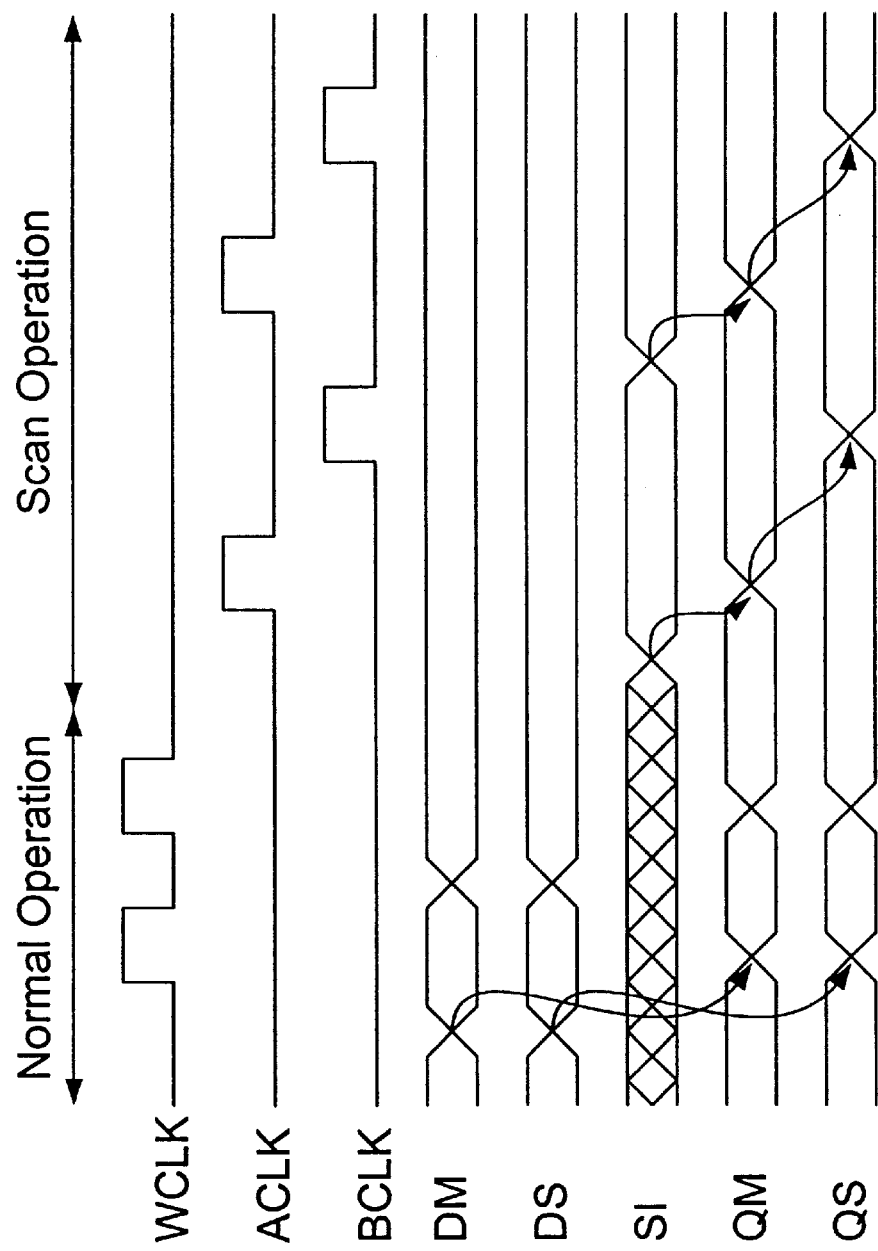
FIG. 3 is a timing diagram for the LSSD storage element of FIG. 2.

The interface 50 is designed to operate in conjunction with a software tool called an automatic test pattern generator ("ATPG") that generates the test patterns used by a tester to test the integrated circuit. In particular, the interface 50 allows the ATPG to control whether the master scan clock ACLK (see FIG. 2) or the slave scan clock BCLK in the LSSD storage element 44 will be asserted first during a scan sequence. Recall for an L2-Star type LSSD storage element, asserting the master scan clock ACLK first will displace the first data bit at the master output signal QM, and likewise for the slave scan clock BCLK. However, oftentimes the first data bit from the master or the slave latch in the L2-Star is, or can be deemed, insignificant or unimportant by the ATPG based on its fault propagation scheme and may be skipped. Stated another way, the efficiency of the test patterns generated removes the necessity of having to capture both of the first data bits. The interface 50 allows the ATPG to select which bit to bypass. Additionally, recall the L2-Star requires a separate write clock WCLK and non-overlapping scan clocks ACLK and BCLK for proper operation thereof The interface 50 generates these clocks from the integrated circuit system clock.

Figure 5:
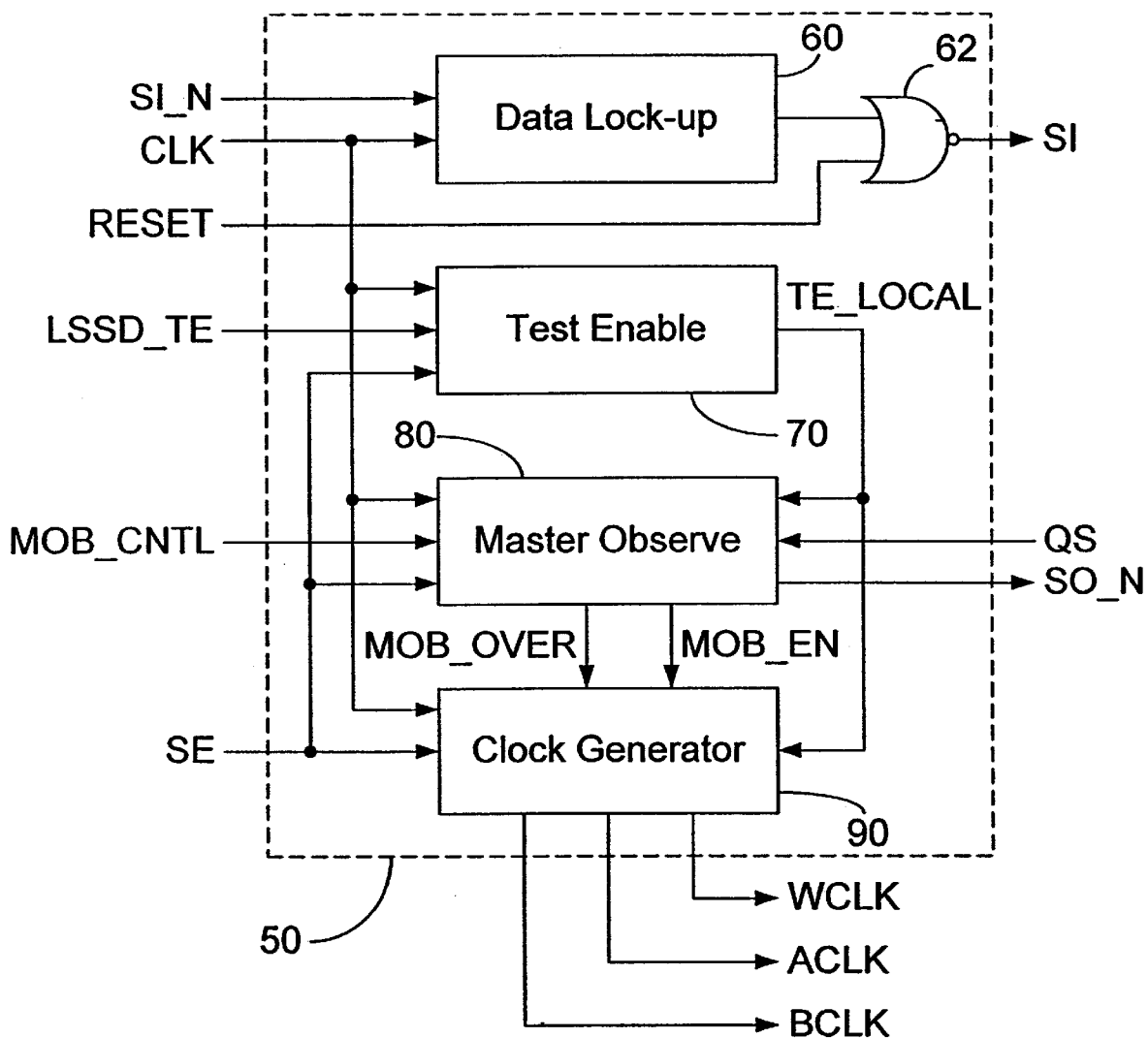
FIG. 5 is a block diagram of an embodiment of the present invention.

In one embodiment, referring now to FIG. 5, the interface 50 has a Data Lock-up module 60, a Test Enable module 70, a Master Observe module 80, and a Clock Generator module 90. The Data Lock-up module 60 serves to latch incoming scan data from, for example, a tester (not shown) or a non-LSSD storage element, so the data may be properly received by an LSSD storage element. The Test Enable module 70 ensures the tester is ready and generates a signal local to the interface 50 to indicate this readiness to the Master Observe module 80. The Master Observe module 80 monitors data scanned out from the integrated circuit and causes the slave scan clock BCLK to be asserted first based on that data, otherwise the master scan clock ACLK is asserted first. Finally, the Clock Generator module 90 generates the necessary non-overlapping scan clocks required for proper operation of the LSSD storage elements.

Each module has a number of signals lines going into and out of the module, as shown. It may be helpful for an understanding of the interface 50 to explain the various signal lines before describing the modules in detail. All signals are active HIGH unless indicated otherwise.

The SI_N signal is a scan-in signal which carries a sequence of bits generated, for example, by the ATPG, to be scanned into the integrated circuit through the scan chain 40 (see FIG. 4). The SI_N signal can come directly from the tester or through one or more non-LSSD storage elements.

However, data from a non-LSSD source passed to an LSSD storage element should be latched first to ensure the LSSD storage element receives the data properly. The SI signal, therefore, is simply the SI_N signal after it has been latched by the Data Lock-up module 40.

The SO_N signal is a scan-out signal carrying a sequence of bits from the integrated circuit through the scan-chain 40 and eventually back to the tester to be compared with expected data.

The CLK signal is a global system clock on board the integrated circuit.

The RESET signal is provided by the integrated circuit and is used to clear the scan chain or a particular portion of the scan chain. Upon assertion of this signal, the scan chain is flushed with LOWs.

The LSSD_TE signal is a global tester enable signal provided by the tester to indicate it is ready. This signal is active LOW.

The TE_LOCAL signal is a tester enable signal generated locally by the Test Enable module 60 to indicate whether the tester is on or off. This signal is active LOW.

The MOB_CNTL signal is a control signal from the integrated circuit for controlling the Master Observe module 80 and is used to enable or disable this module. By default, this signal is usually HIGH.

The MOB_EN signal is a control signal issued by the Master Observe module 80 and dictates whether the output of the master latch is to be "observed" or latched.

The MOB_OVER signal is issued by the Master observe module 80 and is used to indicate the master latch observe sequence is completed. This signal is active LOW.

The SE signal is a scan enable signal provided by the integrated circuit to indicate it is ready for a scan operation.

The QS signal is the slave output signal from the slave latch.

The WCLK signal is the write clock used by the LSSD storage element during normal operation.

The ACLK signal is the master scan clock used by the master latch during scan operation.

The BCLK signal is the slave scan clock used by the slave latch during scan operation.

Following is a description of the different modules of the interface 50. As mentioned previously, the Data Lock-up module 60 serves to latch data coming into the LSSD storage element. The output of the data Lock-up module 60 and the RESET signal are inputted into a NOR gate 62 so upon assertion of the RESET signal, the SI signal which is the output of the NOR gate 62) is reset to LOW.

Figure 6:
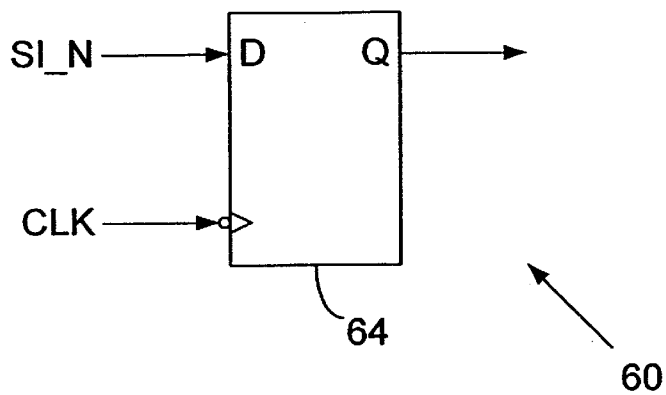
FIG. 6 is a functional diagram of a Data Lock-up module of an embodiment the present invention.

Referring now to FIG. 6, but with continuing reference to FIG. 5 throughout the remainder of the description, in some embodiments, the Data Lock-up module 60 is made of a negative edge-triggered flip-flop 64 connected as shown. Upon receipt of a negative transition of the clock CLK, the flip-flop 64 latches whatever data are at the input D and outputs this data at the output Q of the flip-flop 64. The data are held at the output Q until receipt of another negative transition of the clock signal CLK.

Figure 1A:
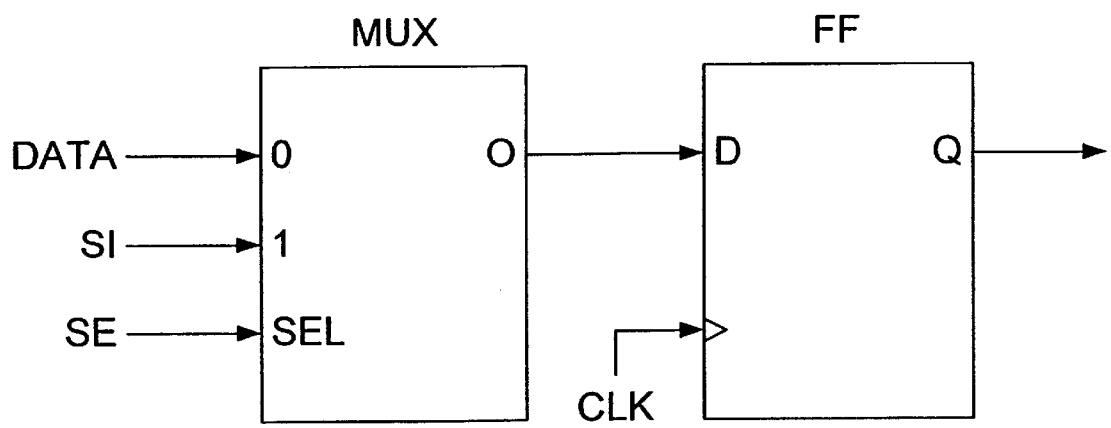
FIGS. 1A–1B are functional diagrams of a prior art Muxscan storage element
Figure 1B:
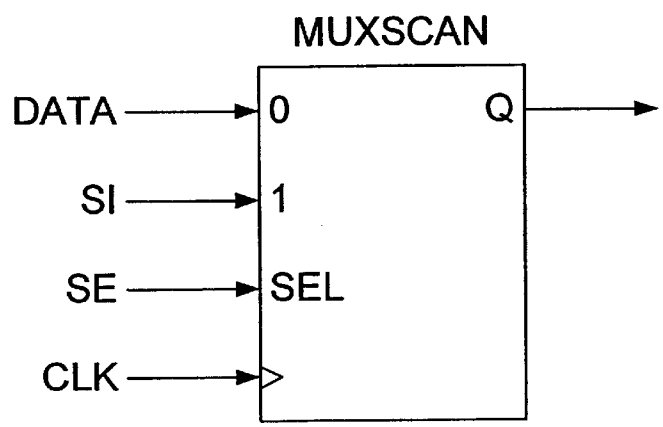
Figure 7:
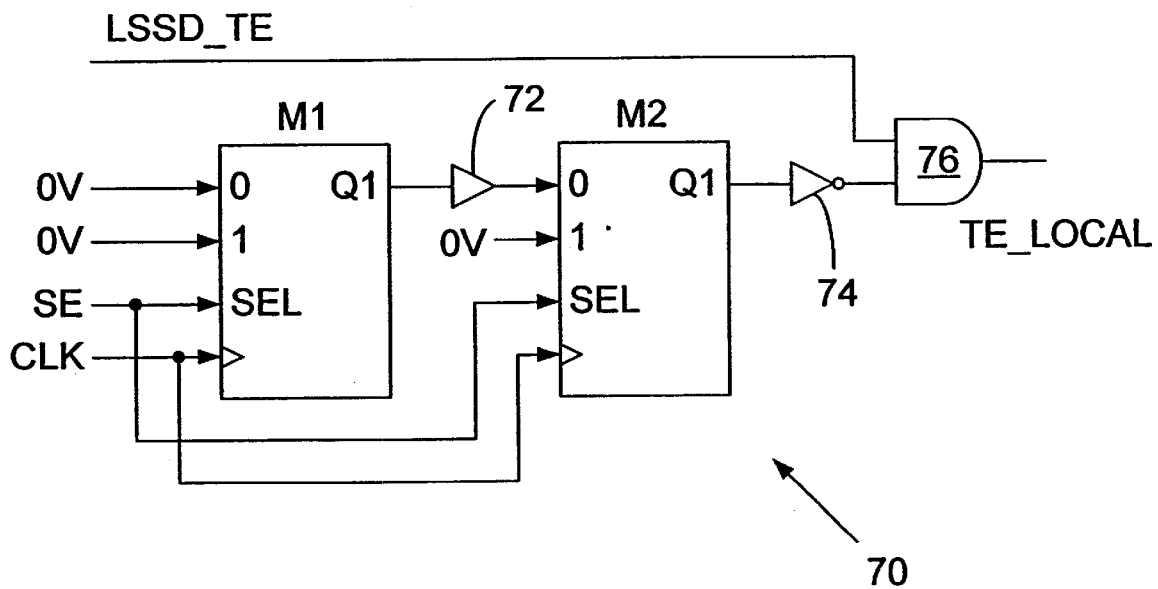
FIG. 7 is a functional diagram of a Test Enable module of an embodiment the present invention.

Referring to FIG. 7, the purpose of the Test Enable module 70 is to ensure the tester is ready and to indicate this fact to the Master Observe module 80 by asserting HIGH the local tester enable signal TE_LOCAL. The Test Enable module 70 is made of first and second Muxscan type (see FIG. 1) storage elements M1 and M2, connected as shown. The outputs of the storage elements M1 and M2 are designated as "Q1" to indicate these outputs have normal polarity only with respect to the 1 inputs and are reverse polarity with respect to the 0 inputs. For example, a HIGH at the 0 input will be inverted to a LOW at the output Q1, whereas no inversion occurs for the 1 input. Both the 0 and 1 inputs of the first storage element M1 are tied to LOW, or 0 volts, as is the 1 input of the second storage element M2. A buffer 72 connects the output Q1 of the first storage element M1 to the 0 input of the second storage element M2. The output Q1 of the second storage element M2, in turn, is connected to an inverter 74, the output of which feeds one input of an AND gate 76. The other input of the AND gate 76 is connected to the global tester enable signal LSSD_TE. The select inputs SEL of both storage elements M1 and M2 are tied to each other and to the scan enable signal SE. Similarly, the clock inputs of both storage elements M1 and M2 are tied to each other and to the global clock signal CLK.

In operation, the local tester enable signal TE_LOCAL is HIGH when both inputs to the AND gate 76 are HIGH, and is LOW when either or both of the inputs to the AND gate 76 are LOW. The two storage elements M1 and M2 normally provide a HIGH to their side of the AND gate 76. For example, when the scan enable signal SE is LOW, the 0 inputs of both storage elements M1 and M2 control, and the Q1 output polarity inversion causes a HIGH to be present at the input of the AND gate 76. On the other hand, when the scan enable signal SE is a HIGH, the 1 inputs control, no polarity inversion applies, and a HIGH is again present at the AND gate 76. As such, assertion of the local tester enable signal TE_LOCAL will usually depend on the logic state of the other input to the AND gate 76, namely, the global tester enable signal LSSD TE. This signal is HIGH when the tester is ready and LOW otherwise.

The only time the storage elements M1 and M2 will provide a LOW to the input of the AND gate 76 is one clock cycle immediately after the scan enable signal SE goes from HIGH to LOW. To demonstrate, while the scan enable signal SE is HIGH, the 1 inputs control, causing a LOW to be present at the 0 input of the second storage element M2 (no polarity inversion). On the clock cycle immediately after a LOW transition of the scan enable signal SE, the LOW which was present at the 0 input of the second storage element M2 becomes HIGH at the output Q1 (polarity inversion). This HIGH is subsequently inverted by the inverter 76, causing a LOW to be present at the input of the AND gate 76. Note the above condition lasts for only one clock cycle, after which the normal HIGH is reasserted at the input of the AND gate 76.

Figure 8:
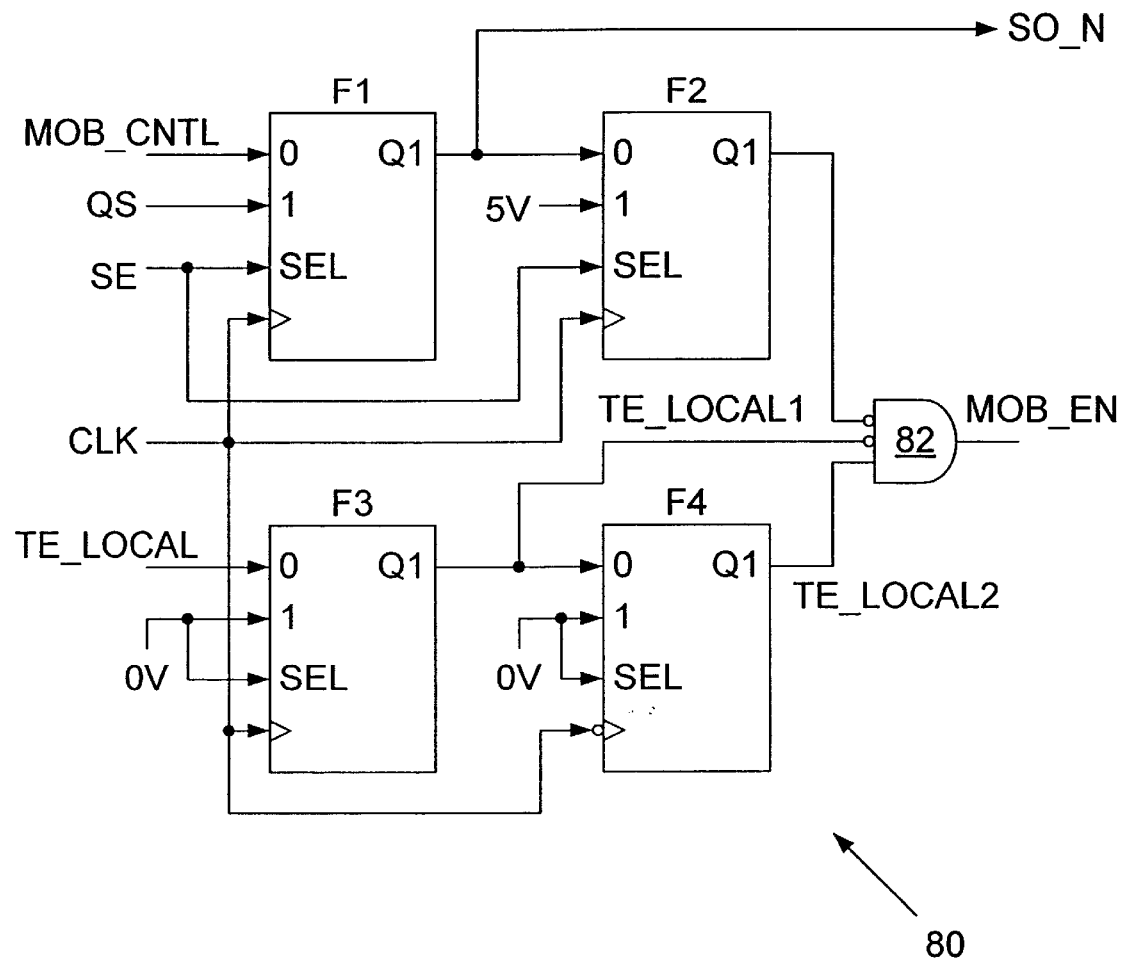
FIG. 8 is a functional diagram of a Master Observe module of an embodiment the present invention.

Referring now to FIG. 8, the purpose of the Master Observe module 80 is to cause the slave scan clock BCLK to be asserted prior to the master scan clock ACLK by asserting HIGH the master observe enable signal MOB_EN based on the scan data received. In one embodiment, the Master Observe module 80 has first, second, third, and fourth Muxscan type storage elements F1–F4, respectively, connected as shown. All four storage elements F1–F4 have an output Q1, indicating reverse polarity with respect to the 0 input, and all are connected to the global system clock CLK. The first storage element F1 functions as the main control for the Master Observe module 80 based on the input signals received by the storage element F1. This storage element also functions as a part of the scan chain 40 (see FIG. 4) and, as such, may be located essentially anywhere within the scan chain 40. The flexibility of the location allows the ATPG to generate an efficient test.

In this embodiment, the first storage element F1 is located in close proximity to an L2-Star type (see FIG. 2) storage element in the scan chain 40 with the slave output signal QS of the L2-Star storage element connected to the 1 input of the first storage element F1. Although the slave output signal QS is used here, other signals at other points of the scan chain may be used instead. The master observe control signal MOB_CNTL is connected to the 0 input of the first storage element F1. The output Q1 of the first storage element F1 is connected to the 0 input of the second storage element F2 and can also be used as the scan-out signal SO_N. In fact, essentially any point in the scan chain may be tapped to obtain scan-out data. Recall the scan-out signal SO_N carries test results from the integrated circuit through the scan chain and eventually out to the tester. The output Q1 of the second storage element F2 is inverted and connected to one input of a 3-input AND gate 82. The select inputs SEL of the first and second storage elements F1 and F2 are connected to each other and to the scan enable signal SE.

As was mentioned previously, the Master Observe module 80 needs the local tester enable signal TE_LOCAL to be asserted HIGH before it can assert the master observe enable signal MOB_EN. In this embodiment, the third and fourth storage elements F3 and F4 serve to latch the local tester enable signal TE_LOCAL and to provide this signal to the 3-input AND gate 82. Because the select inputs SEL (and the 1 inputs) of both the third and fourth storage elements F3 and F4 are tied LOW, the 0 inputs control and polarity inversion occurs. This causes the local tester enable signal TE_LOCAL to be inverted, designated here as TE_LOCAL1, before it is provided to the second input of the AND gate 82. The signal is then inverted again, designated here as TE_LOCAL2, and provided to the remaining input of the AND gate 82. The reason for the second inversion by the fourth storage element F4 is to delay the local tester enable signal TE_LOCAL by one clock cycle before it reaches the AND gate 82. A more detailed explanation of this delay will be provided in the description of FIG. 11.

In operation, the master observe enable signal MOB_EN is asserted only when the Q1 output of the second storage element F2 and the TE_LOCAL1 signal both are LOW, and the TE_LOCAL2 signal is HIGH. However, in this embodiment, the Q1 output of the second storage element F2 is normally HIGH. To demonstrate, when the scan enable signal SE is LOW, the 0 inputs control, polarity inversion occurs, and the output Q1 of the second storage element F2 is HIGH because the master enable control signal MOB_CNTL defaults to HIGH (as stated previously). On the other hand, when the scan enable signal SE is HIGH, the 1 inputs control, no polarity inversion applies, and the output Q1 of the second storage element F2 is HIGH. Any amount of data may be scanned into the first storage element F1 (through the slave output signal QS) at this time, but the output Q1 of the second storage element F2 will remain HIGH because the 1 input of this storage element is tied to 5 volts.

The only time the output Q1 of the second storage element F2 is LOW is one cycle immediately after the scan enable signal SE transitions from HIGH to LOW, and then only if the slave output signal QS is HIGH during the immediately preceding cycle. To demonstrate, while the scan enable signal SE is HIGH, if the slave output signal QS is HIGH, a LOW will be present at the 0 input of the second storage element F2 (no polarity inversion). On the clock cycle immediately after the scan enable signal SE transitions to LOW, the LOW which was present at the 0 input of the second storage element F2 becomes HIGH at the output Q1 (polarity inversion). During this cycle, if the local tester enable signal TE_LOCAL is also HIGH, the master observe enable signal MOB_EN will be asserted HIGH.

Stated in another way, the master observe enable signal MOB_EN is asserted only if the slave output signal QS is HIGH at the end of a scan enable cycle (i.e., when SE transitions from HIGH to LOW) and the local tester enable signal TE_LOCAL is also HIGH.

The Clock Generator module 90 generates the separate, non-overlapping clock signals necessary for proper operation of the LSSD storage elements. There are four main tasks performed by the Clock Generator module 90, each of which is illustrated by discrete logic components as shown in FIGS. 9A–9D.

Figure 9A:
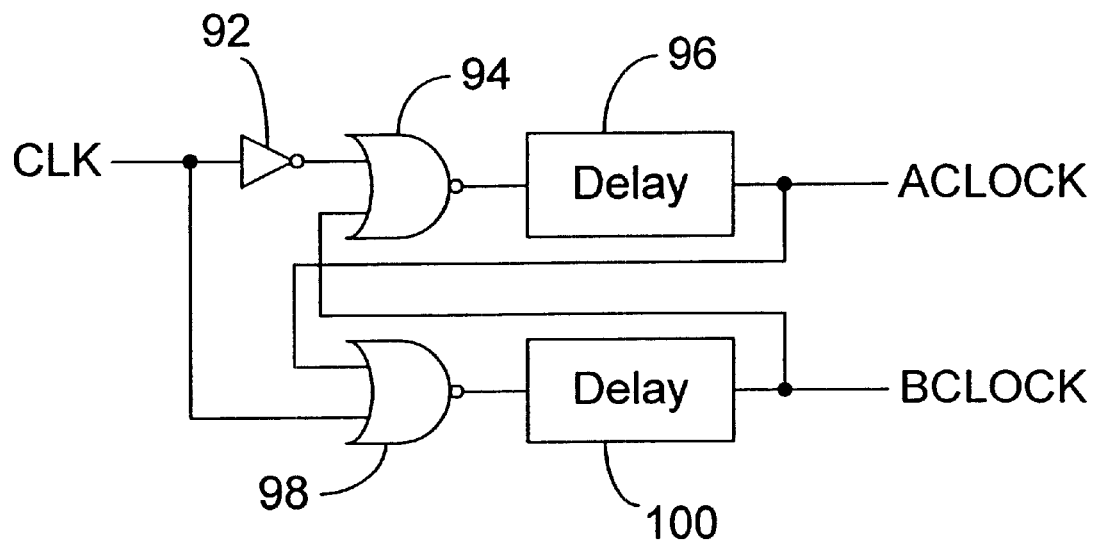
FIGS. 9A–9D are schematic diagram of a Clock Generator module of an embodiment the present invention.

In one embodiment, referring to FIG. 9A, the Clock Generator module 90 generates two separate clocks from the global system clock CLK, a master latch clock ACLOCK and a slave latch clock BCLOCK, that are internal to the Clock Generator module 90. These internal clocks are then used by the Clock Generator module 90, as will be described below, to generate the master and slave scan clocks ACLK and BCLK during a scan operation. The global system clock CLK is passed through an inverter 92 into one input of a first NOR gate 94. The output of the first NOR gate 94 is fed to a first delay block 96 which produces the master latch clock ACLOCK. The master latch clock ACLOCK is then provided to one input of a second NOR gate 98 while the global system clock CLK provides the remaining input. The output of the second NOR gate 98 is fed through a second delay block 100 to produce the slave latch clock BCLOCK. The slave latch clock BCLOCK is then provided at the remaining input of the first NOR gate 94. The first and second delay blocks 96 and 100 serve to delay their respective inputs to prevents the two clocks ACLOCK and BCLOCK from overlapping each other.

Figure 9B:
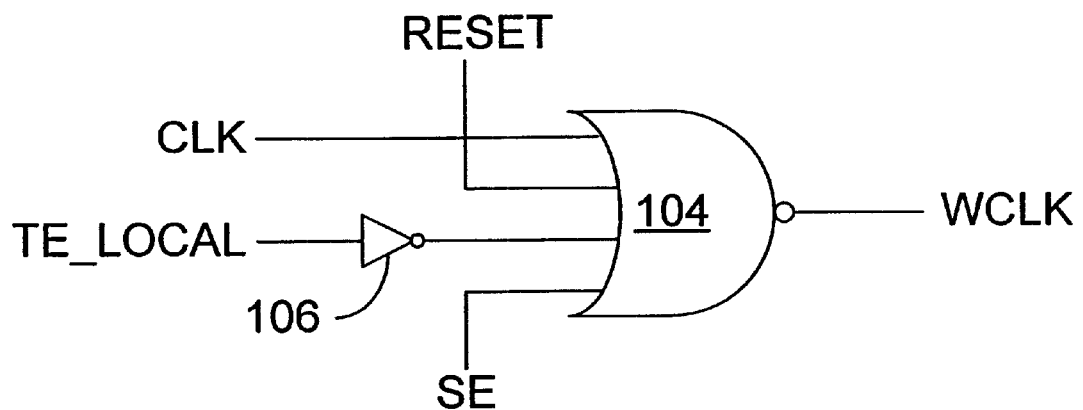

Referring now to FIG. 9B, the Clock Generator module 90 also generates the write clock WCLK. This clock is used primarily to latch data produced by the integrated circuit in normal operation, but is also used for the same purpose in scan operation. The write clock WCLK is the product of a 4-input NOR gate 104, the inputs for which are the reset signal RESET, the global system clock CLK, the scan enable signal SE, and the local tester enable signal TE_LOCAL inverted by an inverter 106. By observation, the output of the NOR gate 104 will be asserted HIGH only when the local tester enable signal TE_LOCAL is HIGH and all other signals are LOW.

Figure 9C:
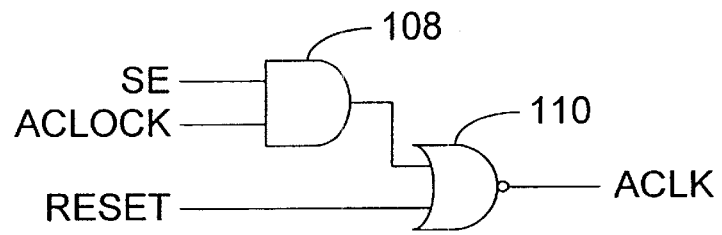

Referring now to FIG. 9C, the master latch clock ACLOCK is used to generate the master scan clock ACLK. The master latch clock ACLOCK and the scan enable signal SE are connected to the inputs of an AND gate 108. The output of the AND gate 108 feeds one input of a NOR gate 110 while the reset signal RESET feeds the other input. By observation, it can be seen the master scan clock ACLK will be asserted HIGH only if the reset signal RESET is LOW, and both scan enable signal SE and master latch clock ACLOCK are not HIGH at the same timne.

Figure 9D:
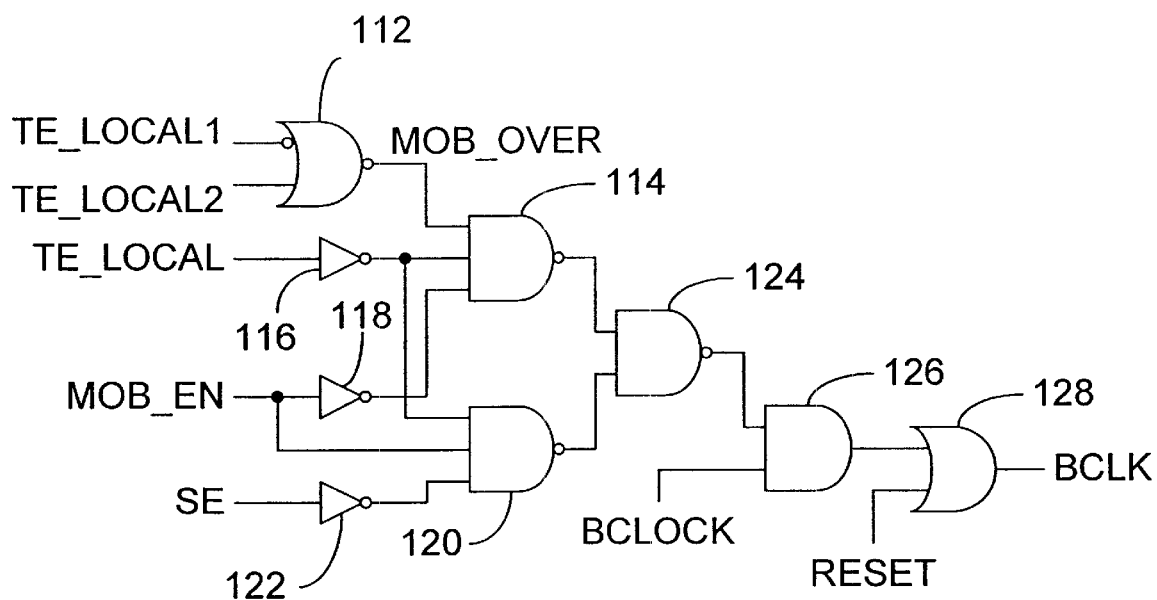

Referring now to FIG. 9D, the slave latch clock BCLOCK is used to generate the slave scan clock BCLK. As can be seen, the TE_LOCAL2 signal and an inverted TE_LOCAL1 signal feed a NOR gate 112, the output from which produces the master observe over signal MOB_OVER. The purpose of the master observe over signal MOB_OVER signal is to prevent an unwanted assertion of the BCLK, as will be explained below. This signal is connected to one input of a first 3-input NAND gate 114 while the other two inputs are connected to the local tester enable signal TE_LOCAL and the master observe enable signal MOB_EN through inverters 116 and 118, respectively. A second 3-input NAND gate 120 is fed by the master observe enable signal MOB_EN, the inverted local tester enable signal TE_LOCAL, and the scan enable signal SE through an inverter 122. The outputs of the two, 3-input NAND gates 114 and 120 are connected to a NAND gate 124. The output of the NAND gate 124 and the slave latch clock BCLOCK feed an AND gate 126. The output of the AND gate 126 and the reset signal RESET are connected to an OR gate 128, the output of which produces the slave scan clock BCLK.

FIG. 9D can best be explained with the aid of the following truth table where '0' and '1' represent LOW and HIGH, respectively, and X represents a "don't care" state.

TABLE 1

| TE_LOCAL | MOB_EN | MOB_OVER | SE | BCLOCK | RESET | BCLK |
|---|---|---|---|---|---|---|
| 0 | 1 | X | 0 | 1 | 0 | 1 |
| 0 | 0 | 1 | 1 | 1 | 0 | 1 |
| 0 | 0 | 1 | 0 | 1 | 0 | 1 |
| 0 | 0 | 0 | X | 1 | 0 | 0 |
| 1 | X | X | X | X | 0 | 0 |

The first row shows when the master observe enable signal MOB_EN is HIGH, the slave scan clock BCLK is also HIGH (as long as the slave latch clock BCLOCK is HIGH, of course). This is the case where the slave scan clock BCLK is being asserted before the master scan clock ACLK at the start of a scan operation.

The second row shows the slave scan clock BCLK is HIGH again when the scan enable signal SE is HIGH. This is the case where normal scanning takes place and the master and slave scan clocks ACLK and BCLK are being asserted alternately.

The third row shows the unwanted case where the master observe enable signal MOB_EN and the scan enable signal SE are both LOW, the slave scan clock BCLK should be LOW, but is still HIGH. However, as shown in the fourth row, the master observe over signal MOB_OVER can be asserted LOW to force the slave scan clock BCLK LOW.

The fifth row shows if the local tester enable signal is LOW, the slave scan clock BCLK will, of course, be LOW.

Figure 10:
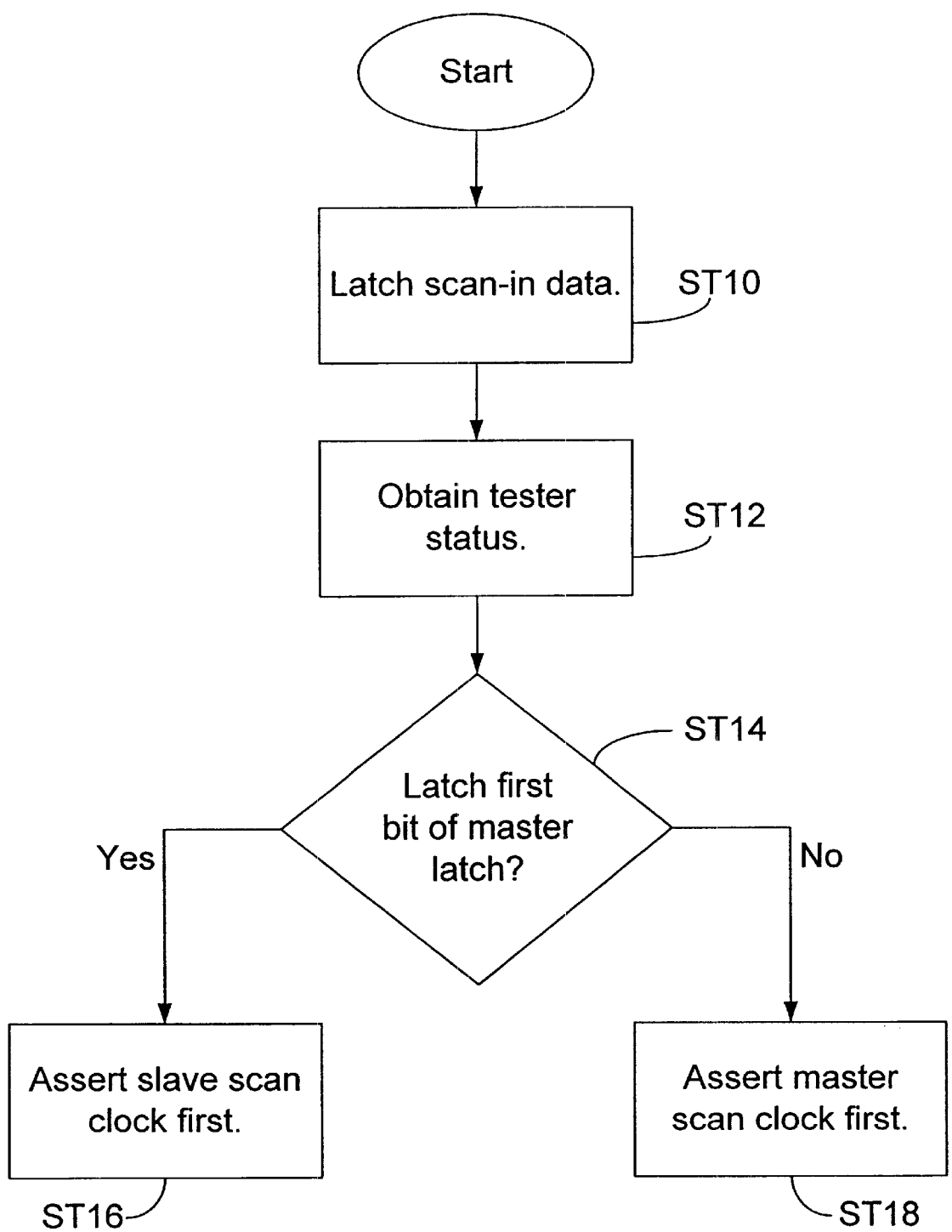
FIG. 10 is flow chart of an embodiment the present invention.

Operation, of the interface 50 can be described with reference to the flow chart shown FIG. 10. First, the interface 50 latches data to be scanned through an LSSD storage element into the integrated circuit (ST10). Next, it obtains the status, of the tester (e.g., enabled or disabled) (ST12). Then, after data from the integrated circuit (produced in response to the scanned in data) is captured in the LSSD storage element, the interface 50 determines whether the first bit of the master latch needs to be "observed" or stored (ST14). If yes, the interface 50 asserts the slave scan clock BCLK before asserting the master scan clock ACLK (ST16). If no, the master scan clock ACLK is asserted first (ST18). Scanning proceeds normally afterwards with the master scan clock ACLK and the slave scan clock BCLK being asserted alternately.

Figure 11:
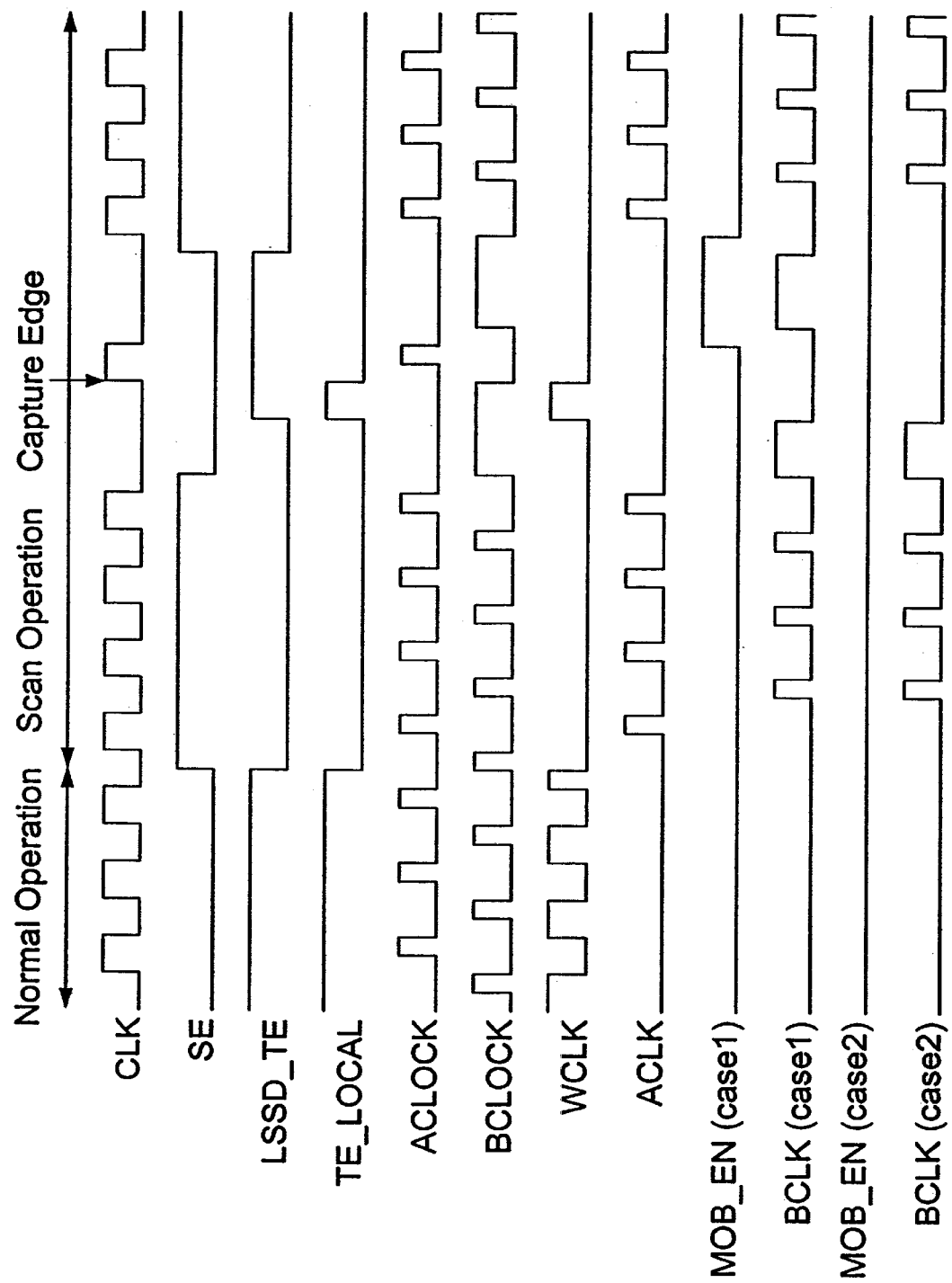
FIG. 11 is a timing diagram of an embodiment the present invention.

The two cases of the operation of the interface 50 above are shown in the timing diagram of FIG. 11. In the timing diagram, the first three signals, CLK, SE, and LSSD_TE are control signals generated externally to the LSSD module 50. All other signals shown are generated, by the LSSD module 50. Note the master scan clock ACLK and slave scan clock BCLK are separate and non-overlapping as required. The write clock WCLK is usually asserled during normal operation, but is also asserted during scan operation immediately before the Capture Edge in order to "capture" or latch outgoing data produced by the integrated circuit in response to the scanned in test data.

Case 1 on the timing diagram is a case where the data on a master latch output signal QM of an L2-Star storage element is important and should be observed (hence the term "Master Observe"). This means the slave output signal QS of the preceding LSSD storage element was HIGH when the scan enable signal transitioned from HIGH to LOW and, in the clock cycle immediately following, the local tester enable signal TE_LOCAL was HIGH. After the data are latched at the Capture Edge, the master observe enable signal MOB_EN is asserted as shown, and the slave scan clock BCLK is assert prior to the master scan clock ACLK. With the assertion of the slave scan clock BCLK, the data at the master output signal QM is latched into the slave output signal QS.

Note the assertion of the master observe enable signal MOB_EN does not occur immediately at the Capture Edge, but about half a cycle later to allow time for the data to be latched. This delay is the reason for having the local tester enable signal TE_LOCAL pass through the fourth storage element F4 (see FIG. 8 and description thereof). Case L2 on the timing diagram is where the data on a master latch output signal QM of an L2-Star storage element is unimportant and does not need to be observed.

There is no assertion of the master observe enable signal MOB_EN after the Capture Edge and the master scan clock ACLK is asserted first, thus displacing the data that was on the output signal QM.

To summarize, the ILSSD interface of the present invention generates separate, non-overlapping clocks for use with an LSSD storage element and facilitates control of whether the master or slave scan clock of the storage element is asserted first during a scan operation. This allows an integrated circuit designed primarily for non-LSSD type storage elements to use LSSDL type storage elements and makes possible the testing of such integrated circuits using ATPG tools.

It is to be understood the embodiments described herein are illustrative only and other embodiments may be derived by one having ordinary skill in the art. For example, although a HIGH on the slave output signal QS at the end of a scan enable cycle is needed to assert the master observe enable signal MOB_EN, in other embodiments, the slave output signal QS may be LOW in accordance with the design of the circuit and test program parameters. Moreover, the particular combination of latches, flip-flops, and discrete logic components comprising the interface 50 as described herein is not intended to be limiting. Other combinations and devices may certainly be used to construct the interface 50 without departing from the scope of the invention. Accordingly, the scope of the invention should be limited only by the following claims.

What is claimed is:

1. A method of interfacing a level-sensitive scan design storage element to a non-level-sensitive scan design storage element in an integrated circuit, the level-sensitive scan design storage element having a master latch and a slave latch, comprising:
    inputting a clock signal of the non-level sensitive scan design storage element to a test module and to a clock generator module;
    generating a test signal and separate, non-overlapping clocks for the master latch and the slave latch from the clock signal using the test module and the clock generator, respectively;
    inputting the test signal and the non-overlapping clocks to a master observe module; and
    controlling an order of asserting the separate, non-overlapping clocks for the master latch and the slave latch based on the test signal.

2. The method of claim 1, further comprising latching data to be scanned into the integrated circuit in a data lock-up module.

3. The method of claim 1, further comprising generating a write clock for the master latch and the slave latch using the clock generator module.

4. The method of claim 1, wherein the separate, non-overlapping clocks include a master scan clock and a slave scan clock.

5. The method of claim 4, wherein an initial data bit of the master latch is latched into the slave latch by asserting the slave scan clock before asserting the master scan clock.

6. An interface for interfacing a level-sensitive scan design storage element with a non-level-sensitive scan design storage element in an integrated circuit, the level-sensitive scan design storage element having a master latch and a slave latch, comprising:
    a test enable module arranged to generate a test enable signal;
    a clock generator module arranged to generate separate, non-overlapping clocks for the master latch and the slave latch; and
    a master observe module connected to the test enable module and clock generator module and configured to selectively latch an initial data bit of the master latch by controlling the separate, non-overlapping clocks of the master latch and the slave latch upon receipt of the tester enable signal.

7. The interface of claim 6, further comprising a data lock-up module configured to latch data to be scanned into the integrated circuit.

8. The interface of claim 6, wherein the clock generator module further generates a write clock for the master latch and the slave latch.

9. The interface of claim 6, wherein the separate, non-overlapping clocks include a master scan clock and a slave scan clock.

10. The interface of claim 9, wherein the master observe module selectively latches an initial data bit of the master latch by asserting the slave scan clock before the master scan clock.

11. The interface of claim 6, wherein the level-sensitive scan design storage element has an L2-Star configuration.

12. An interface for a level-sensitive scan design storage element to a non-level-sensitive scan design storage element in an integrated circuit, the level-sensitive scan design storage element having a master latch and a slave latch, comprising:
    means for inputting a clock signal of the non-level sensitive scan design storage element to a test module and to a clock generator module;
    means for generating a test signal and separate, non-overlapping clocks for the master latch and the slave latch from the clock signal using the test module and the clock generator, respectively;
    means for inputting the test signal and the non-overlapping clocks to a master observe module; and
    means for selectively asserting one of the separate, non-overlapping clocks for the master latch and the slave latch before the other based on the test signal.

13. The interface of claim 12, further comprising means for latching data to be scanned into the integrated circuit in a data lock-up module.

14. The interface of claim 12, further comprising means for generating a write clock for the master latch and the slave latch using the clock generator module.

15. The interface of claim 12, wherein the separate, non-overlapping clocks include a master scan clock and a slave scan clock.

16. The interface of claim 15, wherein an initial data bit of the master latch is latched into the slave latch by asserting the slave scan clock before asserting the master scan clock.

17. An apparatus for interfacing an L2-Star storage element with a Muxscan storage element in an integrated circuit, the L2-Star storage element having a master latch and a slave latch, comprising:

a data lock-up module for latching data to be scanned into the integrated circuit;

a test enable module for generating a tester enable signal;

a clock generator module for generating a write clock and separate, non-overlapping master and slave scan clocks for the master latch and the slave latch; and a master observe module for selectively scanning an initial data bit from the master latch into the slave latch, depending on the generation of the tester enable signal, by asserting the slave scan clock before asserting the master scan clock.

\* \* \* \* \*